(12) United States Patent
Shibasaki et al.

(10) Patent No.: US 7,838,197 B2
(45) Date of Patent: Nov. 23, 2010

(54) PHOTOSENSITIVE COMPOSITION

(75) Inventors: Yoko Shibasaki, Hiki-gun (JP); Kenji Kato, Hiki-gun (JP); Masao Arima, Hiki-gun (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 0 days.

(21) Appl. No.: 11/939,933

(22) Filed: Nov. 14, 2007

(65) Prior Publication Data

US 2008/0113297 A1    May 15, 2008

(30) Foreign Application Priority Data

Nov. 15, 2006 (JP) .............................. 2006-309096

(51) Int. Cl.
   *G03F 7/26* (2006.01)
(52) U.S. Cl. .................. 430/270.1; 430/280.1
(58) Field of Classification Search .............. 430/270.1, 430/302
   See application file for complete search history.

(56) References Cited

U.S. PATENT DOCUMENTS

| | | | |
|---|---|---|---|
| 5,858,617 A * | 1/1999 | Nakayama et al. | 430/281.1 |
| 6,599,679 B2 * | 7/2003 | Philipp et al. | 430/273.1 |
| 6,949,678 B2 * | 9/2005 | Kunimoto et al. | 564/255 |
| 2007/0122742 A1 * | 5/2007 | Kato et al. | 430/270.1 |
| 2007/0128548 A1 * | 6/2007 | Kim et al. | 430/281.1 |

FOREIGN PATENT DOCUMENTS

| | | | |
|---|---|---|---|
| KR | 10-2004-0007700 | * | 1/2004 |
| WO | 1-141904 | | 6/1989 |
| WO | WO 02/096969 A1 | | 12/2002 |
| WO | WO 2006/004158 A1 | | 1/2006 |
| WO | WO 2006004158 A1 | * | 1/2006 |
| WO | WO 2006/018405 A1 | | 2/2006 |

OTHER PUBLICATIONS www.wikipedia.org.*

* cited by examiner

*Primary Examiner*—Cynthia H Kelly
*Assistant Examiner*—Chanceity N Robinson
(74) *Attorney, Agent, or Firm*—Oblon, Spivak, McClelland, Maier & Neustadt, L.L.P.

(57) ABSTRACT

There are provided a photosensitive composition used in one-shot exposure of exposing it via a photomask to light from a UV lamp or in direct writing with light from a UV lamp or laser light to form a patterned latent image to be developed with an alkaline aqueous solution, wherein a difference between maximum absorbance and minimum absorbance, in a wavelength range of 355 to 405 nm, of a dry coating thereof before light exposure is within 0.3 per 25 μm film thickness of the dry coating, and a dry film obtained by applying the photosensitive composition onto a carrier film and then drying it.

9 Claims, 1 Drawing Sheet

PHOTOSENSITIVE COMPOSITION

CROSS-REFERENCE TO RELATED APPLICATIONS

This application is based upon and claims the benefit of priority from prior Japanese Patent Application No. 2006-309096, filed Nov. 15, 2006, the entire contents of which are incorporated herein by reference.

BACKGROUND OF THE INVENTION

1. Field of the Invention

The present invention relates to a photosensitive composition which can be used in both one-shot exposure and direct writing and, in laser direct writing, can be used irrespective of whether the wavelength of laser light is short or long, and to a dry film obtained by applying the composition onto a carrier film and then drying it.

2. Description of the Related Art

A permanent protective film that is a solder resist film is arranged on an outermost layer of a printed-wiring board. For forming this solder resist film, photoresist techniques capable of accurately forming fine patterns are widely used. In particular, photoresist techniques of alkali development type are mainly used from an environmental viewpoint, etc.

As one photoresist technique, one-shot exposure for exposing the whole surface of a dry solder resist coating on a substrate via a photomask to light from a UV lamp has been widely used (Jpn. Pat. Appln. KOKAI Publication No. 1-141904). This one-shot exposure method necessitates position adjustment between a photomask and a substrate, and this position adjustment is time-consuming. The substrate is liable to dimensional change according to heat history in circuit formation so that its dimensions deviate easily from designed dimensions. On the other hand, the photomask does not undergo dimensional change as described above and thus cannot correct the deviation in position of the substrate corresponding to its dimensional deviation. As a pattern becomes finer, the influence of dimensional deviation of the substrate becomes more significant to make accurate formation of a pattern latent image difficult. Formation of an accurate pattern latent image is very cumbersome because it is necessary that dimensions of each substrate after circuit formation are measured and a photomask corresponding thereto is prepared for each substrate. However, the one-shot exposure method has an advantage that because the whole surface of a dry solder resist coating is subjected at one time to one-shot exposure with light from a lamp, a pattern latent image can be rapidly formed.

As another photoresist technique, a direct writing method of directly writing a pattern latent image on a dry solder resist coating, on the basis of data from a computer, by using light from a lamp which generates laser light of single wavelength or UV light is also used (International Publication WO 02/096969). In this direct writing method, there are cases where h-line (405 nm) light from a blue-violet laser diode as a light source is used, light at 355 nm that is the third harmonic component from a YAG laser is used, and light (365, 405, 433 nm) from a high-pressure mercury lamp is used. In this direct writing method, a pattern latent image is formed on a substrate by scanning the substrate with light. Thus, the time for forming a pattern latent image on one substrate becomes longer than by the one-shot exposure method, and therefore productivity tends to decrease. In the direct writing method, however, the deviation of a substrate from designed dimensions as described above can be corrected with a computer by measuring the dimensions of a substrate after circuit formation, whereby a desired accurate pattern latent image can be formed.

Accordingly, both one-shot exposure process and direct writing process are carried out in parallel in production of printed-wiring boards at present. Hence, it is desired that a pattern latent image can be excellently formed by using one kind of photosensitive composition in both the one-shot exposure method and direct writing method.

A photosensitive composition for direct writing with laser is regulated to attain suitable sensitivity toward a single wavelength used, but upon exposure to UV light that is complex light, will be exposed to the light more than necessary, thus suffering from deterioration in the shape of the resulting solder resist film. On the other hand, a photosensitive composition used in the conventional one-shot exposure method has sensitivity in the range of 200 to 600 mJ, and this sensitivity range is too low to cure a thick dry solder resist coating sufficiently by light exposure with a direct imaging device. Generally, a photosensitive composition used in the one-shot exposure method attains higher sensitivity and a broader photosensitive wavelength range by a combination of a photoinitiator that absorbs UV light of relatively short wavelength (up to 370 nm) and a sensitizer that absorbs UV light of long wavelength (380 nm or more). According to the inventors' study, the initiation ability of a photoinitiator exposed directly to light is far higher than the initiation ability of a photoinitiator upon energy transfer from a sensitizer. That is, when the photosensitive composition for one-shot exposure is used, the sensitivity of the photosensitive composition tends to be made higher by irradiation with laser light of shorter wavelength than by laser light of longer wavelength. Accordingly, the sensitivity of the photosensitive composition varies depending on laser direct imaging devices that emit laser lights different in wavelength from one another, which results in a varying sectional shape of the resulting solder resist film.

BRIEF SUMMARY OF THE INVENTION

Accordingly, an object of the present invention is to provide a photosensitive composition which can be used in both one-shot exposure and direct writing and, in laser direct writing, can be used irrespective of whether the wavelength of laser light is short or long, as well as a dry film obtained by applying the composition onto a carrier film and then drying it.

According to a first aspect of the present invention, there is provided a photosensitive composition used in one-shot exposure for exposing the composition via a photomask to light from a UV lamp or in direct writing with light from a UV lamp or laser light to form a patterned latent image to be developed with an alkaline aqueous solution, wherein a dry film of the composition before light exposure has a difference between maximum and minimum value of absorbance of 0.3 or less in a wavelength range of 355 to 405 nm per 25 μm film thickness.

According to another aspect of the present invention, there is provided a dry film obtained by applying the photosensitive composition according to the first aspect onto a carrier film and then drying it.

The photosensitive composition of the present invention is highly sensitive and can be preferably used either in one-shot exposure for exposing the composition via a photomask to light from a UV lamp or in direct writing with light from a UV lamp or laser light. The photosensitive composition of the present invention can be used preferably irrespective of whether the wavelength of the laser light is short or long.

DETAILED DESCRIPTION OF THE INVENTION

Figure 1A:
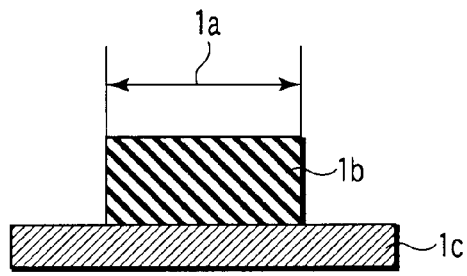
FIGS. 1A to 1E are schematic diagrams of the sectional shape of a solder resist film obtained by exposing a dry coating of the photosensitive composition of the present invention to light and then developing it.

Hereinafter, the present invention will be described in more detail.

The photosensitive composition of the present invention is a photosensitive composition used in one-shot exposure for exposing the composition via a photomask to light from a UV lamp or in direct writing with light from a UV lamp or laser light to form a patterned latent image to be developed with an alkaline aqueous solution, wherein a dry film of the composition before light exposure has a difference between maximum and minimum values of absorbance of 0.3 or less in a wavelength range of 355 to 405 nm per 25 μm film thickness. When the difference in absorbance is 0.3 or less, the composition can be preferably used in formation of a solder resist pattern regardless of the exposure method and whether the wavelength of laser light is short or long, and for example, sufficient surface curability and an excellent shape of the solder resist film can be obtained. The difference in absorbance is more preferably 0.2 or less.

The laser light used in direct writing is preferably laser light of wavelength in the range of 355 to 410 nm.

Although the details will be described later in Examples, the phrase "a difference between maximum absorbance and minimum absorbance, in a wavelength range of 355 to 405 nm, of a dry coating thereof before light exposure is within 0.3 per 25 μm film thickness of the dry coating" means as follows in the present invention. That is, a graph showing the relationship between each of four different film thicknesses of dry-coatings obtained by applying and drying of the photosensitive composition, and the absorbance in a wavelength range of 355 to 405 nm in each respective film thickness of the dry-coatings, is formed. Then, from an approximate expression thereof, the absorbance values of a dry-coating having a film thickness of 25 μm are calculated. Here, the difference between the maximum absorbance and minimum absorbance thus obtained is within 0.3.

Similarly, although the details will be described later in Examples, the phrase "the absorbance, in the wavelength range of 355 to 405 nm, of the dry coating before light exposure is in the range of 0.3 to 1.2 per 25 μm film thickness of the dry coating" means as follows in the present invention. That is, a graph showing the relationship between each of four different film thicknesses of dry-coatings obtained by applying and drying of the photosensitive composition, and the absorbance in a wavelength range of 355 to 405 nm in each respective film thickness of the dry-coatings, is formed. Then, from an approximate expression thereof, the absorbance values of a dry-coating having a film thickness of 25 μm are calculated, and they all fall in a range of 0.3 to 1.2.

When the difference between maximum and minimum values of absorbance, in the wavelength range of 355 to 405 nm, of the dry coating is greater than 0.3 per 25 μm film thickness of the dry coating before light exposure, the photosensitive composition cannot be preferably used in forming a solder resist pattern depending on the exposure method used or the wavelength of laser light used, and for example, sufficient surface curability and an good shape of the solder resist film cannot be obtained.

Preferably, the all absorbance, in the wavelength range of 355 to 405 nm, of a dry coating of the photosensitive composition of the invention before light exposure is in the range of 0.3 to 1.2 per 25 μm film thickness of the dry coating. It is not preferable that the absorbance is less than 0.3, because surface curability cannot be sufficiently obtained. When the absorbance is greater than 1.2, absorption on the surface is marked and sufficient curing depth cannot be attained, so that the formed solder resist film undergoes undercutting, etc., thus often failing to achieve an accurate shape of the solder resist film.

As the photosensitive composition of the present invention, it is possible to use a composition containing (A) a carboxylic acid-containing resin, (B) a photoinitiator, and (C) a pigment.

As the carboxylic acid-containing resin (A), a known conventional resin compound having a carboxyl group in its molecule can be used. Particularly a carboxylic acid-containing photosensitive resin having an ethylenically unsaturated double bond in its molecule is more preferable from the viewpoint of photo-curing and development resistance.

Specific examples of such resin include, but are not limited to:

(1) a carboxylic acid-containing resin obtained by copolymerizing an unsaturated carboxylic acid such as (meth)acrylic acid with one or more other compounds having unsaturated double bonds;

(2) a carboxylic acid-containing photosensitive resin obtained by allowing a compound having an epoxy group and an unsaturated double bond, such as glycidyl (meth)acrylate or 3,4-epoxycyclohexylmethyl (meth)acrylate, or (meth)acrylic acid chloride, to react with a copolymer consisting of an unsaturated carboxylic acid such as (meth)acrylic acid and other one or more compounds having unsaturated double bonds, thereby adding ethylenically unsaturated groups as pendants;

(3) a carboxylic acid-containing photosensitive resin obtained by allowing an unsaturated carboxylic acid such as (meth)acrylic acid to react with a copolymer consisting of a compound having an epoxy group and an unsaturated double bond, such as glycidyl (meth)acrylate or 3,4-epoxycyclohexylmethyl (meth)acrylate, and other compound having an unsaturated double bond, and then allowing the resulting secondary hydroxyl group to react with a polybasic acid anhydride;

(4) a carboxylic acid-containing photosensitive resin obtained by allowing a compound having a hydroxyl group and an unsaturated double bond such as 2-hydroxyethyl (meth)acrylate to react with a copolymer consisting of an acid anhydride having an unsaturated double bond, such as maleic anhydride and other compound having an unsaturated double bond;

(5) a carboxylic acid-containing photosensitive resin obtained by allowing a multifunctional epoxy compound to react with an unsaturated monocarboxylic acid such as (meth)acrylic acid, and then allowing the resulting hydroxyl group to react with a saturated or unsaturated polybasic acid anhydride;

(6) a hydroxyl group-containing carboxylic acid-containing photosensitive resin obtained by allowing a saturated or unsaturated polybasic acid anhydride to react with a hydroxyl group-containing polymer such as a polyvinyl alcohol derivative, and then allowing the resulting carboxylic acid to react with a saturated or unsaturated polybasic acid anhydride;

(7) a carboxylic acid-containing photosensitive resin obtained by allowing a saturated or unsaturated polybasic acid anhydride to react with a reaction product obtaining by reaction between a multifunctional epoxy compound, an unsaturated monocarboxylic acid such as (meth)acrylic acid and a compound (for example, dimethylolpropionic acid, etc.) having, in one molecule thereof, at least one alcoholic hydroxyl group and one reactive group, which reacts with an epoxy group, other than the alcoholic hydroxyl group;

(8) a carboxylic acid-containing photosensitive resin obtained by allowing an unsaturated monocarboxylic acid such as (meth)acrylic acid to react with a multifunctional oxetane compound having at least two oxetane rings in one molecule thereof, and then allowing a saturated or unsaturated polybasic acid anhydride to react with a primary hydroxyl group in the resulting modified oxetane resin; and (9) a carboxylic acid-containing photosensitive resin obtained by allowing an unsaturated monocarboxylic acid (for example, (meth)acrylic acid, etc.) to react with a multifunctional epoxy resin (for example, cresol novolac type epoxy resin, etc.), then allowing the product to react with a polybasic acid anhydride (for example, tetrahydrophthalic anhydride, etc.) to give a carboxylic acid-containing photosensitive resin, and further allowing the resulting resin to react with a compound (for example, glycidyl(meth)acrylate, etc.) having, in its molecule, one oxirane ring and one or more ethylenically unsaturated groups.

Preferable among these resins are the carboxylic acid-containing photosensitive resins (2), (5), (7) and (9) above, and among which the carboxylic acid-containing photosensitive resin (9) above is particularly preferable from the viewpoint of photo-curing and properties of a cured coating.

As used herein, the term "(meth)acrylate" refers collectively to acrylate and methacrylate, and this applies to other analogous terms. Such acrylate compounds and methacrylate compounds may be used alone or as a mixture of two or more thereof.

The carboxylic acid-containing resin (A) has carboxyl groups in side chains of its backbone polymer and can thus be developed with an alkaline aqueous solution.

The acid value of the carboxylic acid-containing resin (A) is preferably in the range of 40 to 200 mg KOH/g, more preferably in the range of 45 to 120 mg KOH/g. It is not preferable that the acid value of the carboxylic acid-containing resin (A) is less than 40 mg KOH/g, because alkali development becomes difficult. It is not preferable either that the acid value of the carboxylic acid-containing resin (A) is more than 200 mg KOH/g, because the dissolution of a light-exposed area with a developing solution proceeds so that a line becomes thinner than necessary, or in some cases, a coating whether on a light-exposed area or on a light-unexposed area is dissolved in a developing solution and peeled-off so as to make it difficult to form a normal solder resist pattern.

The weight-average molecular weight of the carboxylic acid-containing resin (A), though varying depending on its resin skeleton, is generally preferably in the range of 2,000 to 150,000, particularly 5,000 to 100,000. When the weight-average molecular weight is lower than 2,000, tack-free performance may be inferior and a coating after light exposure may be poor in moisture resistance and may result in the film thickness loss during development, thus making the coating significantly inferior in resolution. On the other hand, when the weight-average molecular weight is higher than 150,000, developability may significantly deteriorate and storage stability may deteriorate.

The amount of the carboxylic acid-containing resin (A) can be selected in the range of 20 to 60% by mass, preferably 30 to 50% by mass, based on the total weight of the photosensitive composition of the present invention. It is not preferable that the compounding amount is lower than 20% by mass, because the strength of a coating tends to decrease. It is not preferable either that the amount is higher than 60% by mass, because viscosity is increased and coatability, etc., deteriorate.

As the photoinitiator (B), it is preferable to use at least one member selected from the group consisting of oxime ester photoinitiators having a group represented by the formula (I) below, α-aminoacetophenone photoinitiators having a group represented by the formula (II) below and acylphosphine oxide photoinitiators having a group represented by the formula (III) below.

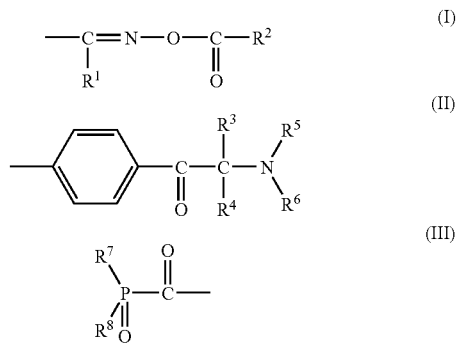

where $R^1$ represents a hydrogen atom; a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group or a benzoyl group which may be substituted with one or more C1 to C6 alkyl groups or phenyl groups, $R^2$ represents a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group or a benzoyl group which may be substituted with one or more C1 to C6 alkyl groups or phenyl groups, $R^3$ and $R^4$ independently represent a C1 to C12 alkyl group or an arylalkyl group, $R^5$ and $R^6$ independently represent a hydrogen atom, a C1 to C6 alkyl group or are bound to form a cyclic alkyl ether group, and $R^7$ and $R^8$ independently represent a C1 to C10 linear or branched alkyl group; a cyclohexyl group; a cyclopentyl group; an aryl group; or an aryl group substituted with one or more halogen atoms, alkyl groups or alkoxy groups, provided that either $R^7$ or $R^8$ may represent R—C(=O)— group wherein R represents a C1 to C20 hydrocarbon group.

Preferable examples of the oxime ester photoinitiators having a group represented by the formula (I) include:

2-(acetyloxyiminomethyl)thioxanthen-9-one represented by the following formula (IV):

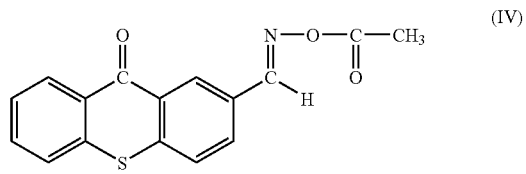

compounds represented by the following formula (V):

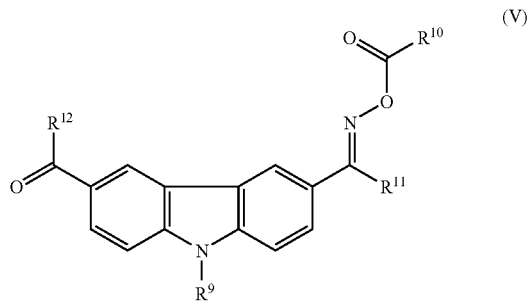

where $R^9$ represents a hydrogen atom; a halogen atom; a C1 to C12 alkyl group; a cyclopentyl group; a cyclohexyl group; a phenyl group; a benzyl group; a benzoyl group; a C2 to C12 alkanoyl group; a C2 to C12 alkoxycarbonyl group provided that when the number of carbon atoms in an alkyl group constituting the alkoxyl group is 2 or more, the alkyl group may be substituted with one or more hydroxyl groups and may have one or more oxygen atoms in an alkyl chain thereof; or a phenoxycarbonyl group, $R^{10}$ and $R^{12}$ independently represent a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group or a benzoyl group which may be substituted with one or more C1 to C6 alkyl groups or phenyl groups, and $R^{11}$ represents a hydrogen atom; a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group or a benzoyl group which may be substituted with one or more C1 to C6 alkyl groups or phenyl groups, and compounds represented by the following formula (VI):

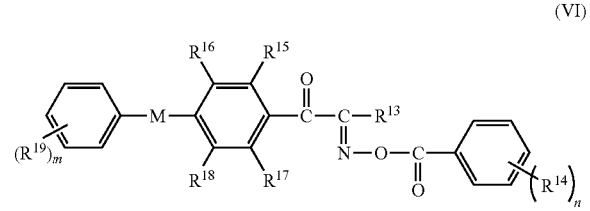

where $R^{13}$ and $R^{14}$ independently represent a C1 to C12 alkyl group, $R^{15}$, $R^{16}$, $R^{17}$, $R^{18}$ and $R^{19}$ independently represent a hydrogen atom or a C1 to C6 alkyl group, M represents O S or NH and m and n each represent an integer number of 0 to 5.

In particular, 2-(acetyloxyiminomethyl)thioxanthen-9-one represented by the formula (IV) and the compounds represented by the formula (V) are more preferable. Commercial products of such compounds include CGI-325, IRGACURE OXE01 and IRGACURE OXE02, all of which are manufactured by Ciba Specialty Chemicals. These oxime ester photoinitiators can be used alone or as a mixture of two or more thereof.

The α-aminoacetophenone photoinitiators having a group represented by the formula (II) include 2-methyl-1-[4-(methylthio)phenyl]-2-morpholinopropanone-1,2-benzyl-2-dimethylamino-1-(4-morpholinophenyl)-butan-1-one, 2-(dimethylamino)-2-[(4-methylphenyl)methyl]-1-[4-(4-morpholinyl)phenyl]-1-butanone, and N,N-dimethylaminoacetophenone. Commercial products include IRGACURE 907, IRGACURE 369 and IRGACURE 379 manufactured by Ciba Specialty Chemicals.

The acylphosphine oxide photoinitiators having a group represented by the formula (III) include 2,4,6-trimethylbenzoyldiphenylphoshine oxide, bis(2,4,6-trimethylbenzoyl)-phenylphosphine oxide and bis(2,6-dimethoxybenzoyl)-2,4,4-trimethyl-pentylphosphine oxide. Commercial products include Lucirin TPO manufactured by BASF and IRGACURE 819 manufactured by Ciba Specialty Chemicals.

The compounding amount of such photoinitiator (B) can be selected in the range of 0.01 to 30 parts by mass, preferably 0.5 to 15 parts by mass, based on 100 parts by mass of the carboxylic acid-containing resin (A). It is not preferable that the amount is less than 0.01 parts by mass, because photo-curing on copper is insufficient so that a coating is peeled-off and coating properties such as chemical resistance deteriorate. It is not preferable either that the amount is more than 30 parts by mass, because the light absorption of the photoinitiator (B) on the surface of a solder resist coating becomes significant so that the curing property in a deep part tends to deteriorate.

The amount of the oxime ester photoinitiators having a group represented by the formula (I) is selected preferably in the range of 0.01 to 20 parts by mass, more preferably 0.01 to 5 parts by mass, based on 100 parts by mass of the carboxylic acid-containing resin (A). Such an oxime ester photoinitiator (I) may react with copper atoms in an interface with copper foil to inactivate functions as a photoinitiator, and is thus used preferably in combination with the α-aminoacetophenone photoinitiator (II) or the like.

The pigment (C) contained in the photosensitive composition of the present invention preferably contains a phthalocyanine blue pigment. The present inventors found that when light with a single wavelength of 405 nm (laser light) is used, the photosensitive composition containing a phthalocyanine blue pigment attains surface curability by exposure to lower light. Although the reason for this sensitizing effect of the phthalocyanine blue pigment is not evident, the absorbance of a photosensitive composition having an absorbance of lower than 0.3 per 25 μm film thickness is merely increased to 0.3 or more by adding phthalocyanine blue to the photosensitive composition, whereby sufficient surface curability and curing depth can be simultaneously achieved by lower light exposure. This sensitization effect is effective for surface reactivity (gloss improvement), whereas curing depth is worsened. That is, this sensitizing effect functions so as to reflect exposure light. This functioning is also effective in stabilizing the shape of a solder resist film. The phthalocyanine blue type pigment includes α-type copper phthalocyanine blue, α-type monochlor copper phthalocyanine blue, β-type copper phthalocyanine blue, ε-type copper phthalocyanine blue, cobalt phthalocyanine blue, and metal-free phthalocyanine blue.

The pigment (C) can be added in an appropriate amount in such range that the difference between the maximum absorbance and minimum absorbance, in the wavelength range of 355 to 405 nm, of a dry coating of the photosensitive composition is within 0.3 per 25 μm film thickness. For example, the suitable amount of the pigment (C) is in the range of 0.01 to 5 parts by mass based on 100 parts by mass of the carboxylic acid-containing resin (A).

Besides, a photoinitiator, a photoinitiation auxiliary and a sensitizer which can be preferably used in the photosensitive composition of the present invention can include benzoin compounds, acetophenone compounds, anthraquinone compounds, thioxanthone compounds, ketal compounds, benzophenone compounds, xanthone compounds and tertiary amine compounds.

Specific examples of the benzoin compounds include benzoin, benzoin methyl ether, benzoin ethyl ether, and benzoin isopropyl ether.

Specific examples of the acetophenone compounds include acetophenone, 2,2-dimethoxy-2-phenylacetophenone, 2,2-diethoxy-2-phenylacetophenone and 1,1-dichloroacetophenone.

Specific examples of the anthraquinone compounds include 2-methylanthraquinone, 2-ethylanthraquinone, 2-t-butylanthraquinone, and 1-chloroanthraquinone.

Specific examples of the thioxanthone compounds include 2,4-dimethylthioxanthone, 2,4-diethylthioxanthone, 2-chlorothioxanthone, and 2,4-diisopropylthioxanthone.

Specific examples of the ketal compounds include acetophenone dimethyl ketal and benzyl dimethyl ketal.

Specific examples of the benzophenone compounds include benzophenone, 4-benzoyl diphenyl sulfide, 4-benzoyl-4'-methyl diphenyl sulfide, 4-benzoyl-4'-ethyl diphenyl sulfide, and 4-benzoyl-4'-propyl diphenyl sulfide.

Specific examples of the tertiary amine compounds include ethanol amine compounds, compounds having a dialkyl aminobenzene structure, for example, dialkylaminobenzophenone such as 4,4'-dimethylaminobenzophenone (Nisso Cure MABP manufactured by Nippon Soda Co., Ltd.) and 4,4'-diethylaminobenzophenone (EAB manufactured by Hodogaya Chemical Co., Ltd.), dialkylamino group-containing coumarin compounds such as 7-(diethylamino)-4-methyl-2H-1-benzopyran-2-one (7-(diethylamino)-4-methyl coumarin), ethyl 4-dimethylaminobenzoate (KAYACURE EPA manufactured by Nippon Kayaku Co., Ltd.), ethyl 2-dimethylaminobenzoate (Quantacure DMB manufactured by International Bio-Synthetics), (n-butoxy)ethyl 4-dimethylaminobenzoate (Quantacure BEA manufactured by International Bio-Synthetics), isoamylethyl p-dimethylaminobenzoate (KAYACURE DMBI manufactured by Nippon Kayaku Co., Ltd.), 2-ethylhexyl 4-dimethylaminobenzoate (Esolol 507 manufactured by Van Dyk) and 4,4'-diethylaminobenzophenone (EAB manufactured by Hodogaya Chemical Co., Ltd.).

Among those described above, the thioxanthone compounds and tertiary amine compounds are preferred. From the viewpoint of curability in a deep part, it is preferable that the composition of the present invention contains thioxanthone compounds, among which thioxanthone compounds such as 2,4-dimethylthioxanthone, 2,4-diethylthioxanthone, 2-chlorothioxanthone and 2,4-diisopropylthioxanthone are preferable.

The amount of such thioxanthone compound is preferably 20 parts by mass or less, more preferably 10 parts by mass or less, based on 100 parts by mass of the carboxylic acid-containing resin (A). It is not preferable that the amount of the thioxanthone compound is too large, because the curability of a thick film is decreased thus leading to the higher cost of the product.

The tertiary amine compounds having a dialkylaminobenzene structure are preferred, among which dialkylaminobenzophenone compounds, or dialkylamino group-containing coumarin compounds having a maximum absorption wavelength of 350 to 410 nm, are particularly preferable. As the dialkylaminobenzophenone compound, 4,4'-diethylaminobenzophenone is preferable due to low toxicity. The dialkylamino group-containing coumarin compounds having a maximum absorption wavelength of 350 to 410 nm have the maximum absorption wavelength in the UV range and can thus provide not only a colorless and transparent photosensitive composition of less coloration but also a colored solder resist film which, when a coloring pigment is used, reflects the color of the coloring pigment. Particularly, 7-(diethylamino)-4-methyl-2H-1-benzopyran-2-one is preferred because of its excellent sensitizing effect with laser light having a wavelength of 400 to 410 nm.

The amount of such tertiary amine compounds is preferably 0.1 to 20 parts by mass, more preferably 0.1 to 10 parts by mass, based on 100 parts by mass of the carboxylic acid-containing resin (A). When the amount of the tertiary amine compound is less than 0.1 parts by mass, a sufficient sensitizing effect tends to be hardly attained. When the amount is more than 20 parts by mass, the light absorption of the tertiary amine compound on the surface of a solder resist coating becomes significant so that curability in a deep part tends to deteriorate.

The photoinitiators, photoinitiation auxiliaries or sensitizers can be used alone or as a mixture of two or more thereof.

The total amount of the photoinitiator, the photoinitiation auxiliary and the sensitizer is preferably in the range of 35 parts by mass or less based on 100 parts by mass of the carboxylic acid-containing resin (A). When the total amount is more than 35 parts by mass, curability in a deep part tends to deteriorate because of light absorption of these.

To impart heat resistance, the photosensitive composition of the present invention can be compounded with a thermosetting component (D) containing 2 or more cyclic ether groups and/or cyclic thioether groups (hereinafter referred to collectively as "cyclic (thio)ether groups") in its molecule.

The thermosetting component (D) having two or more cyclic (thio)ether groups in its molecule is a compound having two or more 3-, 4- or 5-membered cyclic ether groups and/or cyclic thioether groups in its molecule. Examples of such compounds include a compound having two or more epoxy groups in its molecule, that is, a multifunctional epoxy compound (D-1), a compound having two or more oxetanyl groups in its molecule, that is, a multifunctional oxetane compound (D-2), and a compound having two or more thioether groups in its molecule, that is, an episulfide resin (D-3).

Examples of the multifunctional epoxy compound (D-1) include, but are not limited to, bisphenol A type epoxy resin under trade names such as Epicoat 828, Epicoat 834, Epicoat 1001 and Epicoat 1004 manufactured by Japan Epoxy Resin, EPICRON 840, EPICRON 850, EPICRON 1050 and EPICRON 2055 manufactured by Dainippon Ink And Chemicals, Incorporated, EPOTOTE YD-011, YD-013, YD-127 and YD-128 manufactured by Tohto Kasei Co., Ltd., D.E.R. 317, D.E.R. 331, D.E.R. 661 and D.E.R. 664 manufactured by Dow Chemical Ltd., Araldite 6071, Araldite 6084, Araldite GY250 and Araldite GY260 manufactured by Ciba Specialty Chemicals, Sumi-Epoxy ESA-011, ESA-014, ELA-115 and ELA-128 manufactured by Sumitomo Chemical Co., Ltd., and A.E.R. 330, A.E.R. 331, A.E.R. 661 and A.E.R. 664 manufactured by Asahi Kasei Corporation; brominated epoxy resin under trade names such as Epicoat YL903 manufactured by Japan Epoxy Resin, EPICRON 152 and EPICRON 165 manufactured by Dainippon Ink And Chemicals, Incorporated, EPOTOTE YDB-400 and YDB-500 manufactured by Tohto Kasei Co., Ltd., D.E.R. 542 manufactured by Dow Chemical Ltd., Araldite 8011 manufactured by Ciba Specialty Chemicals, Sumi-Epoxy ESB-400 and ESB-700 manufactured by Sumitomo Chemical Co., Ltd., and A.E.R. 711 and A.E.R. 714 manufactured by Asahi Kasei Corporation; novolac type epoxy resin under trade names such as Epicoat 152 and Epicoat 154 manufactured by Japan Epoxy Resin, D.E.N. 431 and D.E.N. 438 manufactured by Dow Chemical Ltd., EPICRON N-730, EPICRON N-770 and EPICRON N-865 manufactured by Dainippon Ink And Chemicals, Incorporated, EPOTOTE YDCN-701 and YDCN-704 manufactured by Tohto Kasei Co., Ltd., Araldite ECN1235, Araldite ECN1273, Araldite ECN1299 and Araldite XPY307 manufactured by Ciba Specialty Chemicals, EPPN-201, EOCN-1025, EOCN-1020, EOCN-104S and RE-306 manufactured by Nippon Kayaku Co., Ltd., Sumi-Epoxy ESCN-195X and ESCN-220 manufactured by Sumitomo Chemical Co., Ltd., and A.E.R. ECN-235 and ECN-299 manufactured by Asahi Kasei Corporation; bisphenol F type epoxy resin under trade names such as EPICRON 830 manufactured by Dainippon Ink And Chemicals, Incorporated, Epicoat 807 manufactured by Japan Epoxy Resin, EPOTOTE YDF-170, YDF-175 and YDF-2004 manufactured by Tohto Kasei Co., Ltd., and Araldite XPY306 manufactured by Ciba Specialty Chemicals; hydrogenated bisphenol A type epoxy resin under trade names such as EPOTOTE ST-2004, ST-2007 and ST-3000 manufactured by Tohto Kasei Co., Ltd.; glycidylamine type epoxy resin under trade names such as Epicoat 604 manufactured by Japan Epoxy Resin, EPOTOTE YH-434 manufactured by Tohto Kasei Co., Ltd., Araldite MY720 manufactured by Ciba Specialty Chemicals, and Sumi-Epoxy ELM-120 manufactured by Sumitomo Chemical Co., Ltd.; hydantoin type epoxy resin under trade names such as Araldite CY-350 manufactured by Ciba Specialty Chemicals; alicyclic epoxy resin under trade names such as Seroxide 2021 manufactured by Daicel Chemical Industries, Ltd. and Araldite CY175 and CY179 manufactured by Ciba Specialty Chemicals; trihydroxyphenylmethane type epoxy resin such as YL-933 manufactured by Japan Epoxy Resin and T.E.N., EPPN-501 and EPPN-502 manufactured by Dow Chemical Ltd.; bixylenol type or biphenol type epoxy resin under trade names such as YL-6056, YX-4000 and YL-6121 manufactured by Japan Epoxy Resin, or mixtures thereof; bisphenol S type epoxy resin such as EBPS-200 manufactured by Nippon Kayaku Co., Ltd., EPX-30 manufactured by Asahi Denka Kogyo K.K., and EXA-1514 manufactured by Dainippon Ink And Chemicals, Incorporated; bisphenol A novolac type epoxy resin under trade names such as Epicoat 157S manufactured by Japan Epoxy Resin; tetraphenylolethane type epoxy resin under trade names such as Epicoat YL-931 manufactured by Japan Epoxy Resin and Araldite 163 manufactured by Ciba Specialty Chemicals; heterocyclic epoxy resin under trade names such as Araldite PT810 manufactured by Ciba Specialty Chemicals and TEPIC manufactured by Nissan Chemical Industries, Ltd.; diglycidylphthalate resin such as Blenmer DGT manufactured by NOF Corporation; tetraglycidylxylenoylethane resin such as ZX-1063 manufactured by Tohto Kasei Co., Ltd.; naphthalene group-containing epoxy resin such as ESN-190 and ESN-360 manufactured by Nippon Steel Chemical Co., Ltd. and HP-4032, EXA-4750 and EXA-4700 manufactured by Dainippon Ink And Chemicals, Incorporated; epoxy resin having a dicyclopentadiene skeleton, such as HP-7200 and HP-7200H manufactured by Dainippon Ink And Chemicals, Incorporated; glycidyl methacrylate copolymer type epoxy resin such as CP-50S and CP-50M manufactured by NOF Corporation; cyclohexyl maleimide/glycidyl methacrylate copolymer epoxy resin; and epoxy-modified polybutadiene rubber derivatives (for example, PB-3600, manufactured by Daicel Chemical Industries, Ltd.), CTBN-modified epoxy resin (for example, YR-102 and YR-450 manufactured by Tohto Kasei Co., Ltd.). These epoxy resins can be used alone or as a mixture of two or more thereof. Among these resins, the novolac type epoxy resin, heterocyclic epoxy resin, bisphenol A type epoxy resin or a mixture thereof is particularly preferable.

The multifunctional oxetane compound (D-2) includes multifunctional oxetane derivatives such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-methyl-3-oxetanylmethoxy)methyl]benzene, (3-methyl-3-oxetanyl) methyl acrylate, (3-ethyl-3-oxetanyl)methyl acrylate, (3-methyl-3-oxetanyl)methyl methacrylate, (3-ethyl-3-oxetanyl)methyl methacrylate or oligomers or copolymers thereof, and etherified compounds of oxetane alcohol with resins having hydroxy groups, such as novolac resin, poly(p-hydroxystyrene), caldo-type bisphenol or derivatives thereof, calixarene or derivatives thereof, calyx resorcin arene or derivatives thereof, and silsesquioxane. Other examples include oxetane ring-containing unsaturated monomer/alkyl (meth)acrylate copolymers.

The compound (D-3) having two or more cyclic thioether groups in its molecule includes, for example, bisphenol A type episulfide resin YL7000, etc., manufactured by Japan Epoxy Resin. Episulfide resin obtained by replacing an oxygen atom in an epoxy group of novolac type epoxy resin by a sulfur atom by using a similar synthesis method can also be used.

The amount of the thermosetting component (D) having two or more cyclic (thio)ether groups in its molecule is preferably in the range of 0.6 to 2.0 equivalents, more preferably 0.8 to 1.5 equivalents, based on 1 equivalent of carboxyl group in the carboxylic acid-containing resin. It is not preferable that the amount of the thermosetting component (D) having two or more cyclic (thio)ether groups in its molecule is less than 0.6, because carboxyl groups remain in a solder resist film, to deteriorate heat resistance, alkali resistance, electrical insulation properties, etc. It is not preferable either that the amount is more than 2.0 equivalents, because low-molecular-weight cyclic (thio)ether groups remain in a dry coating, thereby deteriorating the strength of the coating.

When the thermosetting component (D) having two or more cyclic (thio)ether groups in its molecule is used, a thermosetting catalyst is preferably contained therein. Such thermosetting catalyst includes, for example, imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole; amine compounds such as dicyan diamide, benzyldimethylamine, 4-(dimethylamino)-N,N-dimethylbenzylamine, 4-methoxy-N,N-dimethylbenzylamine and 4-methyl-N,N-dimethylbenzylamine; hydrazine compounds such as adipic acid dihydrazide and sebacic acid dihydrazide; and phosphorus compounds such as triphenyl phosphine. Commercial products include, for example, 2MZ-A, 2MZ-OK, 2PHZ, 2P4BHZ and 2P4 MHZ (all of which are trade names of imidazole-based compounds) manufactured by Shikoku Chemicals Corporation, U-CAT3503N and U-CAT3502T (both of which are trade names of dimethylamine block isocyanate compounds) manufactured by San-Apro Ltd., and DBU, DBN, U-CATSA102 and U-CAT5002 (all of which are bicyclic amidine compounds and salts thereof) manufactured by San-Apro Ltd. The thermosetting catalysts are not particularly limited and may be any thermosetting catalysts for epoxy resin or oxetane compounds, or those accelerating the reaction of an epoxy group and/or an oxetanyl group with a carboxyl group, and such thermosetting catalysts may be used alone or as a mixture of two or more thereof. Alternatively, S-triazine derivatives such as guanamine, acetoguanamine, benzoguanamine, melamine, 2,4-diamino-6-methacryloyloxyethyl-S-triazine, 2-vinyl-2,4-diamino-S-triazine, a 2-vinyl-4,6-diamino-S-triazine/isocyanuric acid adduct and a 2,4-diamino-6-methacryloyloxyethyl-S-triazine/isocyanuric acid adduct can be used, and preferably these compounds also functioning as an adherence conferring agent are used in combination with the above thermosetting catalyst.

The amount of these thermosetting catalysts is satisfactorily in a usual quantitative ratio; for example, the amount is preferably 0.1 to 20 parts by mass, more preferably 0.5 to 15.0 parts by mass, relative to 100 parts by mass of the carboxylic acid-containing resin (A) or the thermosetting component (D) having two or more cyclic (thio)ether groups in its molecule.

The photosensitive composition of the present invention can be compounded, if necessary, with fillers to increase the physical strength of its coating. As the fillers, known conventional inorganic or organic fillers can be used, and particularly barium sulfate, spherical silica and talc are preferably used. Commercial products in which nanosilica is dispersed in a compound having one or more ethylenically unsaturated groups or the multifunctional epoxy resin (D-1), for example, NANOCRYL® XP 0396, XP 0596, XP 0733, XP 0746, XP 0765, XP 0768, XP 0953, XP 0954 and XP 1045, all of which are product grade names, manufactured by Hanse-Chemie, and NANOPOX® XP 0516, XP 0525 and XP 0314, all of which are product grade names, manufactured by Hanse-Chemie, can be used. These can be used alone or as a mixture of two or more thereof.

The amount of these fillers is preferably 300 parts by mass or less, more preferably 0.1 to 300 parts by mass, still more preferably 0.1 to 150 parts by mass, based on 100 parts by mass of the carboxylic acid-containing resin (A). It is not preferable that the amount of the fillers is more than 300 parts by mass, because the viscosity of the photosensitive composition is increased, so printability deteriorate and a cured product become brittle.

The photosensitive composition of the present invention can make use of an organic solvent for synthesizing the carboxylic acid-containing resin (A) and for regulating the composition, or for regulating the viscosity thereof for applying it onto a substrate or a carrier film.

Such organic solvent includes ketones, aromatic hydrocarbons, glycol ethers, glycol ether acetates, esters, alcohols, fatty hydrocarbons and petroleum solvents. Specific examples include ketones such as methyl ethyl ketone and cyclohexanone; aromatic hydrocarbons such as toluene, xylene and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and triethylene glycol monoethyl ether; esters such as ethyl acetate, butyl acetate, dipropylene glycol methyl ether acetate, propylene glycol methyl ether acetate, propylene glycol ethyl ether acetate and propylene glycol butyl ether acetate; alcohols such as ethanol, propanol, ethylene glycol and propylene glycol; fatty hydrocarbons such as octane and decane; and petroleum solvents such as petroleum ether, petroleum naphtha, hydrogenated petroleum naphtha and solvent naphtha. These organic solvents are used alone or as a mixture of two or more thereof.

The photosensitive composition of the present invention can be compounded, if necessary, with conventional heat polymerization inhibitors such as hydroquinone, hydroquinone monomethyl ether, t-butyl catechol, pyrogallol and phenothiazine, conventional thickeners such as pulverized silica, organic bentonite and montmorillonite, anti-foaming agents and/or leveling agents such as those based on silicone, fluorine or polymer, silane coupling agents such as those based on imidazole, thiazole or triazole, and conventional additives such as an antioxidant and a rust preventive.

For example, the photosensitive composition of the present invention is regulated with the organic solvent to attain viscosity suitable for coating, then applied by dip coating, flow coating, roll coating, bar coating, screen printing or curtain coating onto a substrate having a circuit formed thereon, and dried (temporarily dried) at a temperature of about 60 to 100° C. so as to volatilize the organic solvent contained in the composition, whereby a tack-free coating can be formed. The dry coating of the photosensitive composition of the present invention preferably has a thickness of 15 to 100 μm. The photosensitive composition of the present invention can be applied onto a carrier film and dried to give a dry film. A roll of the film is rewound and laminated onto a substrate having a circuit formed thereon, followed by separating the carrier film, whereby a solder resist film can be formed on the substrate having a circuit formed thereon. Thereafter, the solder resist film is exposed to light via a photomask in a contact or non-contact system to form a pattern latent image, or alternatively, a pattern latent image is written with a direct imaging device (a laser direct imaging device or a UV direct imaging device), after which a light-unexposed region is developed with an alkaline aqueous solution (for example, 0.3 to 3% aqueous sodium carbonate solution) to form a solider resist pattern. When a thermosetting component is contained therein, thermosetting by heating for example at a temperature of about 140 to 180° C. causes the reaction between carboxyl groups in the carboxylic acid-containing resin (A) and cyclic (thio)ether groups in the thermosetting component (D) having two or more cyclic (thio)ether groups in its molecule, whereby a cured coating excellent in various properties such as heat resistance, chemical resistance, moisture resistance, adhesiveness and electrical property can be formed.

The substrate includes copper clad laminates for high-frequency circuit of every glade (FR-4, etc.) using, as their material, paper phenol, paper epoxy, glass fabric epoxy, glass polyimide, glass fabric/nonwoven fabric epoxy, glass fabric/paper epoxy, synthetic fiber epoxy, fluorine/polyethylene/PPO/cyanate ester, etc., as well as other polyimide film, PET film, a glass substrate, a ceramic substrate, a wafer plate, etc.

Drying by volatilization, carried out after application of the photosensitive composition of the present invention, can be carried out with a circulating hot air oven, an IR furnace, a hot plate or a convection oven (a method of countercurrent-contacting hot air in a drying oven equipped with a heat source in a system of air heating with vapor and a system of blowing hot air against a support via a nozzle).

A means for light exposure of the photosensitive composition of the invention, that is, a light source used in one-shot exposure or direct writing, is selected from a high pressure mercury lamp, an ultrahigh pressure mercury lamp, a metal halide lamp, a semiconductor laser and a solid laser. The light exposure, though varying depending on the thickness of a dry film of the photosensitive composition of the present invention, can be generally in the range of 5 to 100 mJ/cm$^2$, preferably 5 to 60 mJ/cm$^2$, more preferably 5 to 30 mJ/cm$^2$. As the direct imaging device, it is possible to use, for example, imaging devices manufactured by PENTAX Corporation, Hitachi Via Mechanics, Ltd., BALL Semiconductor Inc., etc.

The development method can include a dipping method, a showering method, a spraying method and a brushing method. The developing solution includes alkaline aqueous solutions of potassium hydroxide, sodium hydroxide, sodium carbonate, potassium carbonate, sodium phosphate, sodium silicate, ammonia, tetramethyl ammonium hydroxide and the like.

The thickness of a solder resist film obtained by curing the photosensitive composition of the present invention is preferably 15 to 100 μm at a maximum.

Hereinafter, the present invention will be described in detail with reference to Examples, but the present invention is not limited thereto.

<Synthesis of Carboxylic Acid-Containing Resin>

A 2-L separable flask equipped with a stirrer, a thermometer, a reflux condenser, a dropping funnel and a nitrogen inlet tube was charged with 660 g of cresol novolac type epoxy resin (EOCN-104S, softening point 92° C., epoxy equivalent=220 g/equivalent, manufactured by Nippon Kayaku Co., Ltd.), 421.3 g of carbitol acetate and 180.6 g of solvent naphtha as solvent, and the epoxy resin was dissolved under stirring by heating at 90° C. Then, the resulting solution was cooled once to 60° C., then 216 g of acrylic acid, 4.0 g of triphenyl phosphine as a reaction catalyst and 1.3 g of methyl hydroquinone as a polymerization inhibitor were added thereto, and the mixture was allowed to react at 100° C. for 12 hours, whereby a reaction product having an acid value of 0.2 mg KOH/g was obtained. 241.7 g of tetrahydrophthalic anhydride was introduced into this product and then allowed to react for 6 hours under heating at 90° C. As a result, a carboxylic acid-containing resin solution having a nonvolatile content=65% by mass, solid acid value=77 mg KOH/g, double bond equivalent (weight (g) of the resin per mole of unsaturated group)=400 g/equivalent, and weight-average molecular weight=7,000, was obtained. Hereinafter, this carboxylic acid-containing resin solution is referred to as A-1 varnish.

Examples 1 to 6, Comparative Examples 1 to 2

The components shown in Table 1 were compounded under stirring in the amounts (parts by mass) shown in Table 1 and dispersed with a triple roll to obtain photosensitive compositions respectively.

TABLE 1

|  | Example | | | | | | Comparative Example | |
| --- | --- | --- | --- | --- | --- | --- | --- | --- |
|  | 1 | 2 | 3 | 4 | 5 | 6 | 1 | 2 |
| A-1 varnish | 154 | 154 | 154 | 154 | 154 | 154 | 154 | 154 |
| Photoinitiator (B-1)*1 | 1 | 1 | 0.8 | 0.8 | 1.12 |  |  |  |
| Photoinitiator (B-2)*2 | 0.25 | 0.35 | 0.20 | 0.20 | 0.38 |  | 1 | 0.4 |
| Photoinitiator (B-3)*3 | 6 | 6 | 6 | 6 | 6 | 6 | 6 | 12 |
| Photoinitiator (B-4)*4 | 1 | 1 | 1 | 1 | 1 | 15 | 1 |  |
| Sensitizer (C-1)*5 |  | 1 |  |  |  |  | 1 | 1 |
| Sensitizer (C-2)*6 |  |  | 0.1 |  |  |  |  | 0.5 |
| Sensitizer (C-3)*7 |  |  |  | 0.5 |  |  |  |  |
| Compound (D-2)*8 | 20 | 20 | 20 | 20 | 20 | 20 | 20 | 20 |
| Filler (E-1)*9 | 130 | 130 | 130 | 130 | 130 | 130 | 130 | 130 |
| Thermosetting component (F-1-1)*10 | 15 | 15 | 15 | 15 | 15 | 15 | 15 | 15 |
| Thermosetting component (F-1-2)*11 | 30 | 30 | 30 | 30 | 30 | 30 | 30 | 30 |
| Phthalocyanine blue | 0.13 | 0.13 | 0.13 | 0.13 |  |  | 0.13 | 0.8 |
| Yellow pigment*12 | 1.2 | 1.2 | 1.2 | 1.2 | 1.2 | 1.2 | 1.2 | 0.25 |
| Pulverized melamine | 3 | 3 | 3 | 3 | 3 | 3 | 3 | 3 |
| Silicone-based anti-foaming agent | 3 | 3 | 3 | 3 | 3 | 3 | 3 | 3 |
| DPM*13 | 5 | 5 | 5 | 5 | 5 | 5 | 5 | 5 |
| #150*14 | 5 | 5 | 5 | 5 | 5 | 5 | 5 | 5 |

Remarks

*1 2-(Acetyloxyiminomethyl) thioxanthen-9-one (oxime ester photoinitiator (I))

*2 Ethanone, 1-[9-ethyl-6-(2-methylbenzoyl)-9H-carbazol-3-yl]-, 1-(0-acetyloxime) (IRGACURE OXE 02 manufactured by Ciba Specialty Chemicals) (oxime ester photoinitiator (I))

*3 2-Methyl-1-[4-(methylthio)phenyl]-2-morpholinopropanone-1 (aminoacetophenone photoinitiator (II))

*4 (2,4,6-Trimethylbenzoyl) diphenylphosphine oxide (acylphosphine oxide photoinitiator (III))

*5 2,4-Diethylthioxanthone

*6 4,4'-bis-Diethylaminobenzophenone

*7 7-(Diethylamino)-4-methyl-2H-1-benzopyran-2-one

*8 Dipentaerythritol hexaacrylate

*9 Barium sulfate (B-30 manufactured by Sakai Chemical Industry Co., Ltd.)

*10 Phenol novolac type epoxy resin (EPPN-201 manufactured by Nippon Kayaku Co., Ltd.)

*11 Bixylenol type epoxy resin (YX-4000 manufactured by Japan Epoxy Resin)

*12 Anthraquinone type yellow pigment

*13 Dipropylene glycol methyl ether acetate

*14 Aromatic organic solvent (trade name: IPUZOL #150) manufactured by Idemitsu Petrochemical The photosensitive compositions in Examples 1 to 6 and Comparative Examples 1 to 2 were used to form solder resist films and tested and evaluated in the following manner to examine the properties of the films.

Comparative Example 3

A commercial photosensitive composition (PSR-4000G23K manufactured by TAIYO INK MFG. CO., LTD.) was tested and evaluated in a similar manner.

(1) Absorbance

Each photosensitive composition was applied via an applicator onto a glass plate and then dried at 80° C. for 30 minutes in a circulating hot air oven, to form a dry coating thereof on the glass plate. The dry coating of each photosensitive composition on the glass plate was measured for its absorbance by means of a UV-visible spectrophotometer (Ubest-V-570DS, manufactured by JASCO Corporation) and an integrating sphere device (ISN-470 manufactured by JASCO Corporation). The same glass plate onto which the photosensitive composition had been applied was measured for its absorbance baseline in the wavelength range of 300 to 500 nm. By subtracting the baseline from the absorbance of the glass plate having the dry coating formed thereon, the absorbance of the dry coating was determined. This operation was carried out using the dry coating whose thickness was changed in 4 stages by the applicator to make a graph showing the relationship between dry-coating thickness and absorbance, and from this graph, the absorbance of the dry solder resist film 25 μm in film thickness was determined. The results in Examples 1 to 6 and Comparative Examples 1 to 2 are shown in Table 2, and the results in Comparative Example 3 are shown in Table 3.

(2) Appropriate Light Exposure

Each photosensitive composition was applied onto the whole surface of a substrate by screen printing. Thereafter, the composition was dried at 80° C. for 20 minutes in a circulating hot air oven to prepare a test specimen. The test specimen was subjected to light exposure with each exposure device. Thereafter, the test specimen was subjected to development treatment with 1.0% by mass aqueous sodium carbonate solution for 60 seconds to obtain a solder resist film. The light exposure of the solder resist film with which 6-stage afterimage sensitivity had been recognized with Kodak Step Tablet No. 2 (21 stages) was regarded as appropriate light exposure for the solder resist film. The results in Examples 1 to 6 and Comparative Examples 1 to 2 are shown in Table 2, and the results in Comparative Example 3 are shown in Table 3.

(3) Surface Curability

A copper-clad substrate having a copper thickness of 35 μm was polished by buff-rolling, then washed with water and dried. Thereafter, each photosensitive composition was applied onto this substrate by screen printing and then dried for 60 minutes in a circulating hot air oven at 80° C. After drying, the dry coating was subjected to light exposure with each exposure device. As the exposure pattern, a whole-surface exposure pattern was used. As the light exposure, the appropriate light exposure determined in (2) was used. After light exposure, the coating was developed (30° C., 0.2 MPa, 1% by mass aqueous sodium carbonate solution) for 60 seconds and then heat-cured at 150° C. for 60 minutes.

The surface curability of the cured coating thus obtained was evaluated by measuring its glossiness at an incidence angle of 60° with a gloss meter MicroTriGloss (manufactured by BYK-Gardner). Assuming that the glossiness of 50 was an evaluation standard, a numerical value of this glossiness or more was regarded as excellent, and a numerical value less than this glossiness was regarded as inferior. The results in Examples 1 to 6 and Comparative Examples 1 to 2 are shown in Table 2, and the results in Comparative Example 3 are shown in Table 3.

(4) Curing Depth and Sectional Shape

Two circuit pattern substrates with a line/space of 300 μm/300 μm in width having copper thicknesses of 50 and 70 μm, respectively, were polished by buff-rolling, then washed with water and dried. Thereafter, each photosensitive composition was applied on each of the circuit pattern substrates by screen printing and dried for 30 minutes in a circulating hot air oven at 80° C. After drying, the dry coating was subjected to light exposure with each exposure device. As the exposure pattern, a pattern in which lines 30/40/50/60/70/80/90/100 μm in width were drawn in this order in the above-mentioned spaces was used. As the light exposure, the appropriate light exposure determined in (2) was used (when the copper thickness was 70 μm, 1.5-fold light exposure was used). After light exposure, the test specimen was developed with 1.0% by mass aqueous sodium carbonate solution to obtain a solder resist pattern. Then, the test specimen was irradiated with 1000 mJ/cm$^2$ UV light from a high-pressure mercury lamp and then heat-cured for 60 minutes. At this time, the remaining minimum line width was evaluated as curing depth. In the table, "100 or more" means that a line 100 μm in width did not remain either.

Figure 1B:
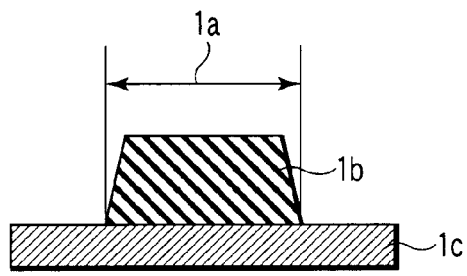
Figure 1C:
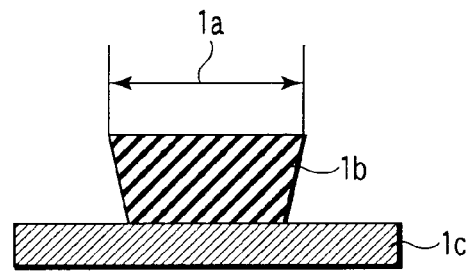
Figure 1D:
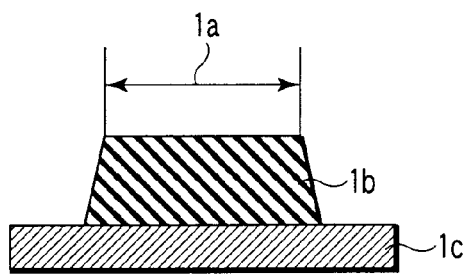
Figure 1E:
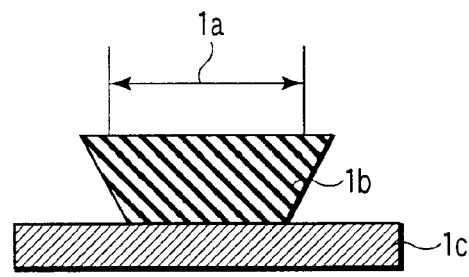

Grade of sectional shape was carried out by observing a section of the line portion in which the designed line width of the cured coating was 100 μm. When the copper thickness was 50 μm, the thickness of the solder resist film was about 45 μm, and when the copper thickness was 70 μm, the thickness of the solder resist film was about 65 μm. The sectional shape was evaluated in five stages A to E according to the schematic diagram in FIGS. 1A to 1E. In the figures, 1a represents a designed value of line width, 1b represents the shape of a solder resist film after exposure and development, and 1c represents a substrate. The state in each evaluation is as follows:

FIG. 1A, Grade A: Ideal state with width as designed,

FIG. 1B, Grade B: Biting of the surface layer due to insufficient development resistance, FIG. 1C, Grade C: Undercut state, FIG. 1D, Grade D: Line thickening due to halation, etc., and FIG. 1E, Grade E: Line thickening and occurrence of undercut on the surface layer.

Both "undercut" and "halation" are terms indicating deviation from a designed value. Undercut indicates that particularly a lower part is made thinner than designed, while halation indicates that an upper part and/or a lower part is made thicker than designed.

Particularly in Grade A samples, deviation from a designed value is within 5 μm in both upper and lower parts of the line.

Not only Grade A samples, but also Grade C and D samples are at a level workable as a solder resist. On the other hand, in Grade B and E samples, the lines and undercut parts are liable to peel-off. Thus, Grade B and E samples are at a level hard to use as a solder resist. In particular, Grade E samples are at an unusable level.

The evaluation results in Examples 1 to 6 and Comparative Examples 1 to 2 are shown in Table 2, and the evaluation results in Comparative Example 3 are shown in Table 3.

TABLE 2

|  |  | Example | | | | | | Comparative Example | |
| --- | --- | --- | --- | --- | --- | --- | --- | --- | --- |
|  |  | 1 | 2 | 3 | 4 | 5 | 6 | 1 | 2 |
| Absorbance (25 μm) | Maximum | 0.59 | 0.68 | 0.59 | 0.68 | 0.54 | 0.44 | 0.71 | 1.22 |
|  | Minimum | 0.39 | 0.48 | 0.41 | 0.49 | 0.36 | 0.45 | 0.35 | 0.49 |
|  | Difference between maximum and minimum | 0.20 | 0.20 | 0.18 | 0.19 | 0.17 | 0.01 | 0.36 | 0.73 |
| I-line (355 nm) laser exposure (exposure device Paragon-8000 manufactured by Orbotech Ltd.) | | | | | | | | | |
| Appropriate light exposure (mJ/cm$^2$) |  | 20 | 20 | 30 | 30 | 15 | 250 | 40 | 60 |
| Sectional shape |  | A | A | A | A | A | A | A or C | E |
| Curing depth minimum line width | 45 μm film thickness | 50 | 50 | 50 | 50 | 30 | 60 | 60 | 100 or more |
|  | 65 μm film thickness | 50 | 50 | 50 | 50 | 40 | 90 | 90 | 100 or more |
| Surface curability | 60° gloss | Excellent | Excellent | Excellent | Excellent | Excellent | Excellent | Excellent | Excellent |
| h-line (405 nm) laser exposure (exposure device DI-μ10 manufactured by PENTAX Corporation) | | | | | | | | | |
| Appropriate light exposure |  | 40 | 40 | 50 | 50 | 30 | 300 | 100 | 300 |
| Sectional shape |  | A | A | A | A | A or B | A | B | A |
| Curing depth minimum line width | 45 μm film thickness | 30 | 40 | 30 | 40 | 30 | 30 | 30 | 30 |
|  | 65 μm film thickness | 40 | 50 | 40 | 50 | 40 | 50 | 40 | 50 |
| Surface curability | 60° gloss | Excellent | Excellent | Excellent | Excellent | Almost excellent | Almost excellent | Inferior | Almost excellent |
| High-pressure mercury lamp direct-writing exposure (Mercurex manufactured by Dainippon Screen Mfg. Co., Ltd.) | | | | | | | | | |
| Appropriate light exposure |  | 30 | 30 | 30 | 30 | 20 | 200 | 30 | 100 |
| Sectional shape |  | A | A | A | A | A | A | A | C |
| Curing depth minimum line width | 45 μm film thickness | 30 | 40 | 30 | 40 | 30 | 30 | 40 | 30 |
|  | 65 μm film thickness | 40 | 50 | 40 | 50 | 40 | 50 | 60 | 50 |
| Surface curability | 60° gloss | Excellent | Excellent | Excellent | Excellent | Excellent | Excellent | Excellent | Excellent |
| High-pressure mercury lamp one-shot exposure (with a photomask) (exposure device EXP-2960 manufactured by Oak Co., Ltd.) | | | | | | | | | |
| Appropriate light exposure |  | 20 | 20 | 20 | 20 | 20 | 200 | 50 | 80 |
| Sectional shape |  | A | A | A | A | A | A | A | C |
| Curing depth minimum line width | 45 μm film thickness | 30 | 40 | 30 | 40 | 30 | 30 | 30 | 30 |
|  | 65 μm film thickness | 40 | 50 | 50 | 50 | 40 | 40 | 60 | 40 |
| Surface curability | 60° gloss | Excellent | Excellent | Excellent | Excellent | Excellent | Excellent | Excellent | Excellent |

TABLE 3

| Maximum absorbance 0.99; minimum absorbance 0.49; difference 0.50 | | | | | |
| --- | --- | --- | --- | --- | --- |
|  |  | 355 nm laser direct writing device | 405 nm laser direct writing device | High-pressure mercury lamp direct writing device | High-pressure lamp mask exposure |
| Appropriate light exposure |  | 300 mJ | 400 mJ | 300 mJ | 200 mJ |
| Sectional shape |  | E | D | C | A or C |
| Curing depth minimum line width | 45 μm film thickness | 50 | 30 | 60 | 30 |
|  | 65 μm film thickness | — | 40 | 70 | 50 |
| Surface curability | 60° gloss | Excellent | Inferior | Excellent | Excellent |

As is evident from Tables 2 and 3, the photosensitive composition of the present invention, in which the difference between the maximum absorbance and minimum absorbance, in the wavelength range of 355 to 405 nm, of a dry coating thereof before light exposure is within 0.3 per 25 μm film thickness of the dry coating, can be used preferably in any exposure methods, and can give excellent results regardless of whether the wavelength of laser light is short or long. On the other hand, the photosensitive composition, in which the difference between the maximum absorbance and minimum absorbance is not within 0.3, is not suitable for use because the properties of the resulting solder resist film are unsatisfactory depending on the exposure method and the wavelength of laser light used.

Example 7

The photosensitive composition in Example 1 obtained from the components shown in Table 1 above was diluted with methyl ethyl ketone. The resulting dilution was applied onto a carrier film and then dried by heating for 30 minutes in a hot-air drying oven at 80° C. to form a light curing/thermosetting resin composition layer 25 μm in film thickness, on which a cover film was laminated to obtain a dry film.

Thereafter, the cover film was removed, the dry film was laminated on a copper foil substrate having a pattern formed thereon by thermal laminate, and then subjected to exposure under the same conditions (shown in Table 2) as in Example 1. Then the carrier film was removed, followed by development for 60 seconds with 1% by mass aqueous sodium carbonate solution to obtain an image. Further, the test specimen was heat-cured for 60 minutes in a hot-air drying oven at 150° C. to prepare a test substrate. The test substrate having the resulting cured coating was examined for its properties by the test method and evaluation method described above. The results are the same as Example 1 in Table 2.

As described in detail, the present invention can provide a photosensitive composition which can excellently form a pattern latent image regardless of whether one-shot exposure or direct writing is used as an exposure method. The photosensitive composition of the present invention can be used preferably regardless of whether the wavelength of laser light is short or long.

What is claimed is:

1. A photosensitive composition, comprising:
    a carboxylic acid-containing resin;
    a photoinitiator in an amount of 0.01 to 30 parts by mass to 100 parts by mass of the carboxylic acid-containing resin;
    a pigment in an amount of 0.01 to 5 parts by mass to 100 parts by mass of the carboxylic acid-containing resin; and
    a sensitizer comprising at least one compound selected from the group consisting of thioxanthone compounds and dialkylamino group-containing coumarin compounds having a maximum absorption wavelength of 350 to 410 nm,
    wherein when exposed by one-shot exposure via a photomask to light from a UV lamp or in direct writing with light from a UV lamp or laser light, the photosensitive composition forms a patterned latent image which is developed with an alkaline aqueous solution, the photosensitive composition forms the patterned latent image in both the one-shot exposure and the direct writing, the photosensitive composition in a form of a dry coating before light exposure has a difference between maximum absorbance and minimum absorbance, in a wavelength range of 355 to 405 nm, which is within 0.3 per 25 μm film thickness of the dry coating, the photoinitiator comprises oxime ester photoinitiators, α-aminoacetophenone photoinitiators and acylphosphine oxide photoinitiators, the oxime ester photoinitiators have a group represented by a formula (I),

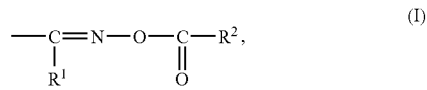

the α-aminoacetophenone photoinitiators have a group represented by a formula (II),

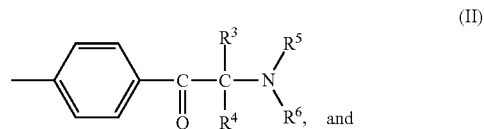

the acylphosphine oxide photoinitiators have a group represented by a formula (III),

where $R^1$ represents a hydrogen atom; a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group, or a benzoyl group which may be substituted with one or more C1 to C6 alkyl groups or phenyl groups, $R^2$ represents a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group, or a benzoyl group which may be substituted with one or more C1 to C6 alkyl groups or phenyl groups; $R^3$ and $R^4$ independently represent a C1 to C12 alkyl group or an arylalkyl group, $R^5$ and $R^6$ independently represent a hydrogen atom, a C1 to C6 alkyl group or are bound to form a cyclic alkyl ether group; and $R^7$ and $R^8$ independently represent a C1 to C10 linear or branched alkyl group; a cyclohexyl group; a cyclopentyl group; an aryl group; or an aryl group substituted with one or more halogen atoms, alkyl groups or alkoxy groups, provided that either $R^7$ or $R^8$ may represent R—C(=O)— group wherein R represents a C1 to C20 hydrocarbon group.

2. The photosensitive composition according to claim 1, wherein the absorbance, in the wavelength range of 355 to 405 nm, of the dry coating before light exposure is in the range of 0.3 to 1.2 per 25 μm film thickness of the dry coating.

3. The photosensitive composition according to claim 1, wherein the oxime ester photoinitiators having a group represented by the formula (I) contain a compound represented by a formula (IV):

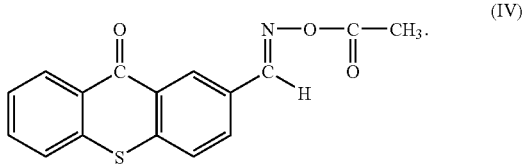

4. The photosensitive composition according to claim 1, wherein the oxime ester photoinitiators having a group represented by the formula (I) contain a compound represented by a formula (V):

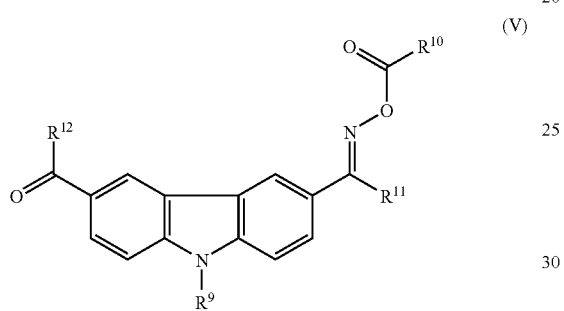

where $R^9$ represents a hydrogen atom; a halogen atom; a C1 to C12 alkyl group; a cyclopentyl group; a cyclohexyl group; a phenyl group; a benzyl group; a benzoyl group; a C2 to C12 alkanoyl group; a C2 to C12 alkoxycarbonyl group provided that when the number of carbon atoms in an alkyl group constituting the alkoxyl group is 2 or more, the alkyl group may be substituted with one or more hydroxyl groups and may have one or more oxygen atoms in an alkyl chain thereof; or a phenoxycarbonyl group, $R^{10}$ and $R^{12}$ independently represent a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group, or a benzoyl group which may be substituted with one or more C1 to C6 alkyl groups or phenyl groups, and $R^{11}$ represents a hydrogen atom; a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group, or a benzoyl group which may be substituted with one or more C1 to C6 alkyl groups or phenyl groups.

5. The photosensitive composition according to claim 1, wherein the pigment contains a phthalocyanine blue pigment.

6. The photosensitive composition according to claim 1, further containing a thermosetting component (D) having two or more cyclic ether groups and/or cyclic thioether groups in its molecule.

7. The photosensitive composition according to claim 1, wherein a light source in the one-shot exposure or direct writing is selected from the group consisting of high pressure mercury lamp, an ultrahigh pressure mercury lamp, a metal halide lamp, a semiconductor laser and a solid laser.

8. A dry coating, comprising:
a photosensitive composition according to claim 1, wherein the dry coating has a film thickness of 15 to 100 μm.

9. A photosensitive composition, comprising:
a carboxylic acid-containing resin;
a photoinitiator, in an amount of 0.01 to 30 parts by mass to 100 parts by mass of the carboxylic acid-containing resin;
a pigment in an amount of 0.01 to 5 parts by mass to 100 parts by mass of the carboxylic acid-containing resin; and
a sensitizer comprising at least one compound selected from the group consisting of thioxanthone compounds and dialkylamino group-containing coumarin compounds having a maximum absorption wavelength of 350 to 410 nm,
wherein when exposed by one-shot exposure via a photomask to light from a UV lamp or in direct writing with light from a UV lamp or laser light, the composition forms a patterned latent image which is developed with an alkaline aqueous solution, the photosensitive composition forms the patterned latent image in both the one-shot exposure and the direct writing, the photoinitiator is a combination consisting of oxime ester photoinitiators, α-aminoacetophenone photoinitiators and acylphosphine oxide photoinitiators, the oxime ester photoinitiators have a group represented by a formula (I),

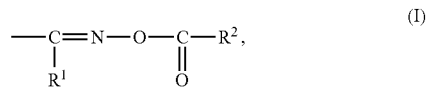

the α-aminoacetophenone photoinitiators have a group represented by a formula (II),

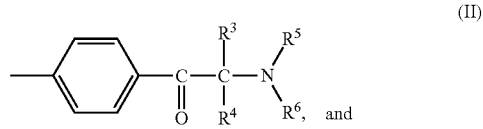

the acylphosphine oxide photoinitiators have a group represented by a formula (III),

where $R^1$ represents a hydrogen atom; a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group, or a benzoyl group which may be substituted with one or more C1 to C6 alkyl groups or phenyl groups, $R^2$ represents a phenyl group which may be substituted with one or more C1 to C6 alkyl groups, phenyl groups or halogen atoms; a C1 to C20 alkyl group which may be substituted with one or more hydroxyl groups and may have one or more oxygen atoms in an alkyl chain thereof; a C5 to C8 cycloalkyl group, a C2 to C20 alkanoyl group, or a benzoyl group which may be substituted with one or more C1 to C6 alkyl groups or phenyl groups; $R^3$ and $R^4$ independently represent a C1 to C12 alkyl group or an arylalkyl group, $R^5$ and $R^6$ independently represent a hydrogen atom, a C1 to C6 alkyl group or are bound to form a cyclic alkyl ether group; and $R^7$ and $R^8$ independently represent a C1 to C10 linear or branched alkyl group; a cyclohexyl group; a cyclopentyl group; an aryl group; or an aryl group substituted with one or more halogen atoms, alkyl groups or alkoxy groups, provided that either $R^7$ or $R^8$ may represent R—C(=O)— group wherein R represents a C1 to C20 hydrocarbon group.

* * * * *